United States Patent [19]
Naito

[11] Patent Number: 5,536,588
[45] Date of Patent: Jul. 16, 1996

[54] AMORPHOUS ORGANIC THIN FILM ELEMENT AND AMORPHOUS ORGANIC POLYMER COMPOSITION

[75] Inventor: Katsuyuki Naito, Yokohama, Japan

[73] Assignee: Kabushiki Kaisha Toshiba, Kawasaki, Japan

[21] Appl. No.: 97,029

[22] Filed: Jul. 27, 1993

[30] Foreign Application Priority Data

Aug. 27, 1992 [JP] Japan ..................................... 4-228348
Mar. 1, 1993 [JP] Japan ..................................... 5-040226

[51] Int. Cl.⁶ .................................................. H05B 33/14
[52] U.S. Cl. ......................... 428/690; 428/691; 313/503; 313/506
[58] Field of Search .................................... 428/917, 690; 313/503–509

[56] References Cited

U.S. PATENT DOCUMENTS

| | | | |
|---|---|---|---|
| 3,961,314 | 6/1976 | Klose et al. | 340/173 LS |
| 4,687,968 | 8/1987 | Frayer et al. | 313/509 |
| 5,256,945 | 10/1993 | Imai et al. | 313/504 |

OTHER PUBLICATIONS

Hamada et al. "Evaluation of Oxadiazole Derivatives as Organic Electroluminescent Materials" Chem Soc Japan 1991 (11) pp. 1540–1548.
Pre–Prints of the Annual Meeting of the Chemical Society of Japan Hiroshi Inada, Yasuhiko Shirota p. 997, 1992.
Pre–Prints of the Annual Meeting of the Chemical Society of Japan Watalu Ishikawa, Hiroshi Inada, Hideyuki Nakano, Yaruhiko Shirota p. 997, 1992.
Pre–Prints of the Annual Meeting of the Chemical Society of Japan. Katsuyuki Naito, Syun Egussa, Yoko Watanabe, Akira Miwa p. 2230, 1992.

*Primary Examiner*—Charles R. Nold
*Attorney, Agent, or Firm*—Oblon, Spivak, McClelland, Maier & Neustadt

[57] ABSTRACT

Disclosed is an amorphous organic thin-film element containing dye molecules with $\Sigma \Delta S_{tr,m}$ (J/(K.kmol))/Mw of 60 or less, assuming that the molecular weight is Mw and the sum total of an entropy change of melting and entropy changes of transition from a glass transition point to a melting point is $\Sigma \Delta S_{tr,m}$ (J/(K.kmol)), and having a high heat resistance and a high stability over long periods of time.

16 Claims, 2 Drawing Sheets

AMORPHOUS ORGANIC THIN FILM ELEMENT AND AMORPHOUS ORGANIC POLYMER COMPOSITION

BACKGROUND OF THE INVENTION

1. Field of the Invention

The present invention relates to an amorphous organic thin-film element and an amorphous organic polymer composition for use in various applications.

2. Description of the Related Art

Recently, various types of electronic devices using ultra thin films of organic substances have been extensively researched. Among other organic thin films, an amorphous thin film is very important in transparency, homogeneity, and stability because the film has no grain boundary. As an example, an organic photoconductor (OPC) used in a Carlson process employs an amorphous thin film in which a charge-generation agent or a charge-transport agent is dispersed or dissolved homogeneously in an amorphous polymer. As for very thin films of organic substances represented by a Langmuir-Blodgett film (LB film), an amorphous LB film consisting of a polymer or a dye is more homogeneous than a crystalline LB film consisting of an aliphatic acid and therefore has good properties as an ultra thin insulating film (e.g., Published Unexamined Japanese Patent Application No. 63-166261). In addition, electroluminescence (EL) elements using vapor-deposited films of organic substances have been developed in recent years (e.g., Published Unexamined Japanese Patent Application Nos. 57-51781, 59-194393, and 63-295695). In the case of these elements, a thin film with a film thickness of about 10 nm is required in order to decrease the application voltage. For this reason, an amorphous thin film is used to obtain an element which can withstand a vapor deposition process for an upper electrode, causes no electrical short circuit, and has a high operating stability. Organic thin films which can transport electrons or holes efficiently are necessary for organic photovoltaic cells or organic rectifying elements as well as the organic electrophotographic photosensitive bodies or the organic EL elements described above, and so a demand has also arisen for stable amorphous thin films for use in these electronic elements. Furthermore, amorphous organic polymer compositions in which dye molecules are contained in amorphous polymers are used not only as bulk materials but as thin films in the organic photoconductors described above, photosensitive resist thin films, optical switching elements using optical waveguides, and optical disks. The amorphous organic polymer compositions are also widely used as a variety of coating thin films.

Almost no thin films consisting of low-molecular materials, however, unlike thin films using polymers, have been put into practical use as amorphous thin films for electronic devices. The major cause of this is that many of low molecular weight materials have low glass transition temperatures (Tg) and hence are low in heat resistances, so crystallization is encouraged by heat generated when elements are driven, resulting in easy occurrence of degradation. In addition, in the case of a system in which dye molecules are contained in a polymer, if amorphous dye molecules having a low Tg are used in such a system, the Tg of the whole system decreases to lead to a decrease in heat resistance. Note that in such a system, although mixing of crystalline dye molecules into a polymer can prevent the decrease in Tg, the dye concentration cannot be raised because a homogeneous dispersion state is difficult to obtain. Note also that the heat resistance can be improved by chemically bonding the dye molecules to the polymer, but this is accompanied by a difficulty in synthesis.

SUMMARY OF THE INVENTION

It is an object of the present invention to provide an amorphous organic thin-film element and an amorphous organic polymer composition which have high heat resistances.

An amorphous organic thin-film element according to the present invention comprises an organic thin film containing dye molecules with $\Sigma \Delta Str,m$ (J/(K.kmol))/Mw of 60 or less, assuming that a molecular weight is Mw and the sum total of an entropy change of melting and entropy changes of transition from a glass transition point to a melting point is $\Sigma \Delta Str,m$ (J/(K.kmol)).

An amorphous organic polymer composition according to the present invention contains, in an amorphous polymer, dye molecules with $\Sigma \Delta Str,m$ (J/(K.kmol))/Mw of 60 or less, assuming that a molecular weight is Mw and the sum total of an entropy change of melting and entropy changes of transition from a glass transition point to a melting point is $\Sigma \Delta Str,m$ (J/(K.kmol)).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The present invention will be described in detail below.

Generally, the heat resistance of an organic thin film is determined by the Tg of an organic material used. The Tg, however, changes depending on measurement conditions, such as a sample quantity and a heating rate. For this reason, it was conventionally very difficult to develop a material which yields an amorphous thin film having a high Tg and a high heat resistance by systematically comparing and examining the heat resistances of organic materials.

The present inventor has investigated parameters serving as indexes for the development of a material which gives a high Tg. First, according to the entropy theory by Adam and Gibbs (G. Adam, J. H. Gibbs; J. Chem. Phys., 43, 139

(1965)), a shear viscosity η of a glass forming liquid has the following relation:

$$\eta = A \exp(B/T\Delta Sc)$$

where A and B are constants and ΔSc is the difference in entropy between the crystal and supercooled liquid at a temperature T. On the other hand, it has been experimentally confirmed that the following relation is established at a melting point Tm, assuming that an entropy change of melting is ΔSm:

$$\text{Log}\eta = \text{Log}A' + B'.\text{Mw}/\Delta Sm$$

That is, while A is a constant, B changes in accordance with a compound, and B=B'Tm. Therefore, the following relation is obtained at a glass transition point:

$$\eta g = A \exp(B'Tm/(Tg.\Delta Sg/Mw))$$

where ΔSg is the difference in entropy between the glass and crystal at a glass transition point Tg.

The present inventor has investigated the relationship between Tm/(ΔSg/Mw) and ΣΔStr,m/Mw and found that the following relation is established:

$$Tm/(\Delta Sg/Mw) = A'' - B''.\Sigma\Delta Str,m/Mw$$

Tg that is experimentally obtained is observed when η reaches a certain value (normally about $10^{13}$ P). This yields:

$$B'Tm/(Tg \cdot \Delta Sg/Mw) = C \text{ (constant)}$$

$$Tg = B'/C \cdot Tm/(\Delta Sg/Mw)$$
$$= C'(A'' - B'' \cdot \Sigma\Delta Str,m/Mw)$$

The present inventor has actually examined the thermal properties of various dye molecules and investigated the relationship between ΣΔStr,m/Mw as a parameter of a thermodynamic characteristic of each molecule and Tg of an amorphous thin film consisting of that molecule. In this investigation, the values of Tg of molecules used as materials were measured under the same conditions of a sample quantity of 10 to 20 mg and a heating rate of 5° C./min by using a commercially available differential scanning calorimeter (DSC). The sum total, on the other hand, of an entropy change of melting and an entropy change of transition from a glass transition point to a melting point is a characteristic value inherent in a substance. The result was a graph shown in FIG. 1.

Figure 1:
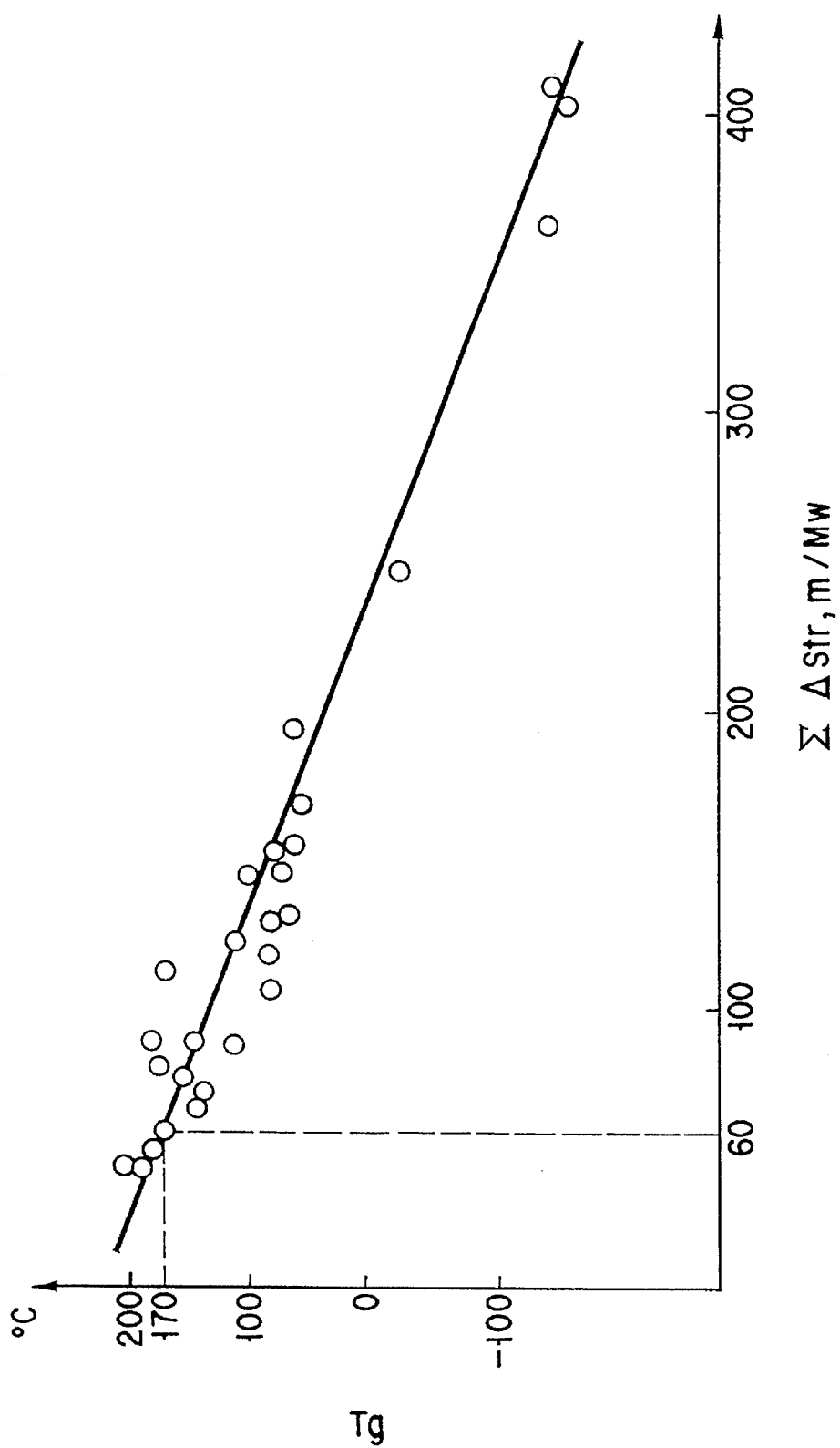
FIG. 1 is a graph showing the relationship between $\Sigma \Delta Str,m/Mw$ and Tg for various organic dye molecules.

As shown in FIG. 1, assuming that the molecular weight is Mw and the sum total of an entropy change of melting and entropy changes of transition from a glass transition point to a melting point is ΣΔStr,m, there is an inverse correlation between ΣΔStr,m/Mw and Tg. This reveals, therefore, that Tg increases when ΣΔStr,m/Mw is decreased. From FIG. 1, Tg is approximately 170° C. or more when ΣΔStr,m/Mw is 60 or less.

Note that the value of ΣΔStr,m/Mw corresponds to the value of entropy per unit mass, and so the measurement is possible by using the DSC even for a dye molecule whose molecular weight Mw and molecular structure are unknown. In addition, in the case of a dye molecule mixture consisting of two or more types of dye molecules which are produced simultaneously in the course of manufacture and hence very difficult to separate, it is practically impossible to obtain the value of ΣΔStr,m/Mw of each individual dye molecule. In such a dye molecule mixture, however, the value of ΣΔStr, m/Mw or the sum total of an entropy change of melting and an entropy change of transition from a glass transition point to a melting point per unit mass is larger than the value of smallest ΣΔStr,m/Mw of individual dye molecules mixed. Therefore, if the sum total of an entropy change of melting and an entropy change of transition from a glass transition point to a melting point per unit mass of a mixture measured using the DSC is 60 J/(K.kg) or less, this indicates that the mixture contains dye molecules having ΣΔStr,m/Mw of 60 or less. It can be consequently determined that the value of Tg of this mixture is high.

The value of 170° C. described above is equal to or larger than Tg of polycarbonate (poly(oxycarbonyl-1,4-phenyleneisopropylidene- 1,4-phenylene), i.e., 160° C., which is an amorphous polymer extensively used because of its high transparency and high heat resistance. This demonstrates that almost no decrease in Tg takes place in an amorphous organic polymer composition of the present invention in which dye molecules meeting the above conditions are mixed in polycarbonate. That is, even when dye molecules meeting the above conditions are mixed in polycarbonate or polyimide having a high Tg, i.e., so-called engineering plastic, among other amorphous polymers, almost no degradation occurs in heat resistance, and the result is an amorphous organic polymer composition that is stable over long periods of time. In addition, even if an amorphous polymer having a relatively low Tg, for example, an acryl-based amorphous polymer is used, the Tg value of the resultant composition can be raised by increasing the content of dye molecules meeting the above conditions.

To decrease ΣΔStr,m/Mw of a dye molecule, it may be possible to increase its Mw. In general, however, ΣΔStr,m also increases when Mw is increased. Therefore, it is necessary to increase Mw without increasing ΣΔStr,m.

A quantitative relation has been reported as to the relationship between ΣΔStr,m and a molecular structure. According to an HSE theory (J. O. Hirschfelder, D. P. Stevenson, H. Eyring; J. Chem. Phys., 5, 896 (1937)), for example, the following relation is established:

$$\Sigma\Delta Str,m = \Delta Sp + \Delta Sm(rot)$$

where ΔSp is the entropy change resulting from positional disordering from the crystal, which is equal to a gas constant R in a spherical molecule. ΔSm(rot) is represented by:

$$\Delta Sm(rot) = Sr - Stor$$

where Sr is the entropy change between a state in which the motion of molecules is completely frozen and a gas state in which they can freely rotate, and Stor is the entropy term of a torsional vibration which is permitted in the crystal. Sr is represented by:

$$Sr = R[\pi^{1/2}(T/39.6)^{3/2} 10^{60} (I_1 I_2 I_3)^{1/2}/\sigma]$$

where $I_i$ is the molecular rotational moment about an i axis. Therefore, the smaller the value of $I_1 I_2 I_3$, the smaller the value of Sr. To meet this condition, it is required that atoms be concentrated near the center of gravity. In the above relation, π represents the number of centers of symmetry. When the value of π is large, for example, when a dye molecule has an axis of symmetry, such as a C-3 axis and a C-4 axis, the value of S decreases. That is, to increase the molecular weight while minimizing $\Delta$Sm(rot), it is preferable to introduce a rigid skeleton having no degree of freedom in conformation, such as a benzene ring, a biphenyl ring, or a condensed ring, at the center of a molecule. In addition, substituent groups are preferably, densely introduced such that a molecule forms not a linear or asymmetrical structure but a spherical structure which is as symmetrical as possible. A practical example is a dye molecule having a structure in which a substituent group with a dye skeleton is introduced to the 1-, 3-, and 5-position of a benzene ring or the 3-, 3'-, 5-, and 5'-position of a biphenyl ring. It is also preferable to introduce a rigid substituent group having no degree of freedom in conformation, such as a t-butyl group, to the outermost portion of a molecule.

Stor, on the other hand, is represented by:

$$Stor = \Sigma Sv$$

where Sv is the entropy term of a torsional vibration of each bond in a molecule. Generally, when the molecular weight increases, Stor also increases, but the amount of its increase is smaller than that in Sr. Therefore, the change in Sr contributes more to the total change in $\Delta$Sm(rot).

A maximum crystal growth velocity MCV (mm/min) and a corresponding temperature $Tc_{max}$ are also important properties of an amorphous thin film in addition to Tg. When the value of MCV decreases, crystallization becomes difficult to induce. This facilitates the formation of an amorphous thin film, and the amorphous thin film formed is stable. In addition, when the value of $Tc_{max}$ increases, it becomes difficult for an amorphous thin film to crystallize due to heat generated when an element is driven.

The present inventor has found that the smaller the value of $\Sigma\Delta$Str,m/Mw, the larger the value of $Tc_{max}$. The present inventor has also found that MCV, on the other hand, has correlations with an enthalpy change of melting $\Delta$Hm (kJ/mol) and a melting point Tm (K); the larger the value of Mw/(Tm.$\Delta$Hm), the smaller the value of MCV.

Figure 2:
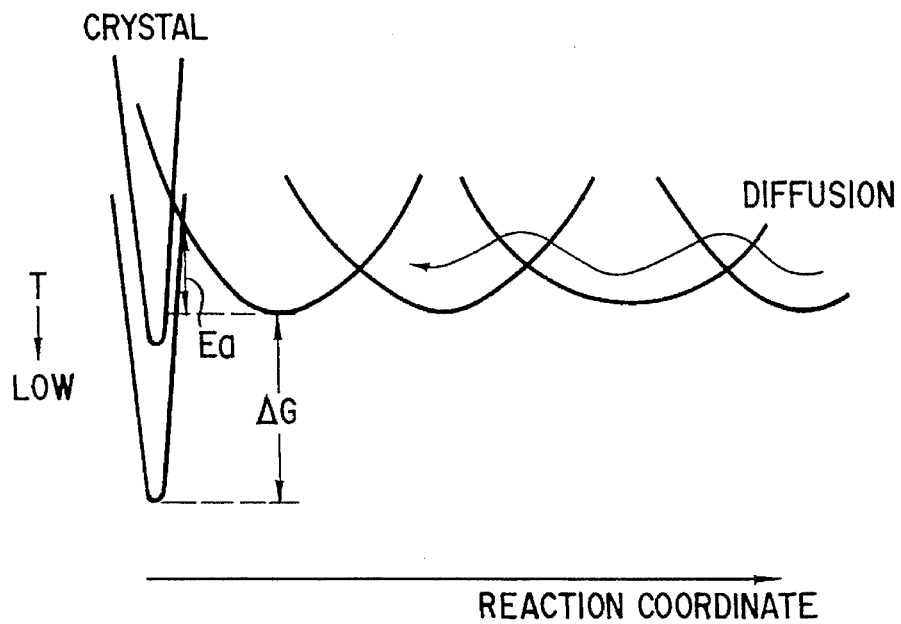
FIG. 2 is a schematic view showing the reaction coordinate where crystal growth progresses.

The correlation between MCV and (Tm-$\Delta$Hm) will be described below. The crystal growth of a supercooled liquid involves two processes: one is diffusion of molecules in the supercooled liquid, and the other is crystallization of molecules on the surface of the crystal. It is known that the diffusion is rate-determining at low temperatures and the crystallization on the surface of the crystal is rate-determining at high temperatures. The diffusion velocity abruptly decreases when the temperature decreases, whereas the crystallization velocity on the surface of the crystal abruptly increases when the temperature decreases to a low temperature below the melting point and decreases when the temperature further decreases. It is, therefore, considered that the maximum crystallization velocity MCV is determined by the balance between the diffusion and the crystallization in a strict sense. In practice, however, a temperature which gives MCV is not much lower than the melting point, so it is considered that the effect of diffusion is not so dominant. FIG. 2 schematically shows the reaction coordinate where crystal growth progresses. At high temperatures, the potential curve of a supercooled liquid molecule is moderate and diffusion occurs easily. At a temperature immediately below the melting point, however, the crystallization velocity is low due to a high activation energy (Ea). When the temperature further decreases, a free energy difference ($\Delta$G) between the supercooled liquid and the crystal increases, and so an activation energy (Ea) decreases, with the result that the crystallization velocity increases. Assuming that the degree of supercooling at MCV is $\Delta$T (=Tm - $Tc_{max}$), the following relation is approximately established:

$$\Delta G = \Delta Hm.\Delta T/Tm$$

Since $\Delta T = Tm - Tc_{max} = \alpha Tm$ is experimentally established, $\Delta G = \alpha \Delta Hm$. In addition, it is considered from FIG. 2 that a relation represented by:

$$Ea = A.Mw/\Delta G$$

is established as the primary approximation between the activation energy Ea and the $\Delta$G. Therefore, the maximum crystallization velocity MCV is:

$$\begin{aligned} MCV &= k_o \exp(-Ea/k_B Tc_{max}) \\ &= k_o \exp(-A' \cdot Mw/(Tm \cdot \Delta Hm)) \end{aligned}$$

therefore, $$Log(MCV) = B - A'.Mw/(Tm.\Delta Hm)$$

Especially when Mw/(Tm.$\Delta$Hm) is 0.04 or more, MCV is 1 mm/min or less, and the resultant amorphous state is very stable. As an example, toluene which has Mw/(Tm.$\Delta$Hm) of 0.078 readily becomes amorphous and is stable, whereas benzene which has Mw/(Tm.$\Delta$Hm) of 0.028 cannot become stable amorphous because it easily crystallizes. In the present invention, therefore, it is desirable that an organic thin-film element or an amorphous organic polymer composition contain dye molecules having $\Sigma\Delta$Str,m/Mw of 60 or less and Mw/(Tm.$\Delta$Hm) of 0.04 or more.

In the amorphous polymer composition according to the present invention, a dye molecule content of sum total of the amorphous polymer and dye molecules ranges from 1 to 80 wt %, preferably from 5 to 60 wt %.

Note that the present inventor has also found that a dye molecule having a molecular weight of 350 or more and incorporating a plurality of sites where an intermolecular hydrogen bond can be formed yields a high Tg even if its $\Sigma\Delta$Str,m/Mw is 60 or more. The reason for this is considered that association of molecules occurs owing to the network of hydrogen bonds between dye molecules each having a plurality of sites where formation of an intermolecular hydrogen bond is possible, and this increases a practical Mw, resulting in a decrease in a practical $\Sigma\Delta$Str,m/Mw. Such a dye molecule, therefore, can be preferably used in the present invention together with the dye molecule having $\Sigma\Delta$Str,m (J/(K.kmol))/Mw of 60 or less. In this case, the smaller the value of $\Sigma\Delta$Str,m/Mw, the larger the value of Tg. The value of Mw is preferably large, more preferably 450 or more.

In the present invention, the amorphous thin film can be basically used as a single-layered film. It is, however, preferable to use the amorphous thin film in the form of a multilayered structure when the film is used in a device by combining the film with other thin films having different functions.

Conventional processes can be applied as a method of manufacturing the amorphous thin film. Examples are a cast process, a vapor deposition process, an LB process, a water-surface development process, and an electrolytic process. Among other processes, the vapor deposition process is simple and performs well in manufacturing particularly multilayered films. In the present invention, although a thin film containing the dye molecules as described above has a high heat resistance, it is effective to form chemical bonds between dye molecules during or after film formation in order to further increase the heat resistance.

Practical structures and the principles of driving of the amorphous organic thin-film elements of the present invention will be briefly described below.

(Organic electroluminescence element)

This element has a structure in which an organic thin film is sandwiched between two electrodes at least one of which is a transparent electrode. This organic thin film has either a two-layered structure constituted by a luminescent layer, which contains fluorescent dye molecules, and a hole-transport layer or an electron-transport layer, or a multilayered structure constituted by three or more layers, in which the luminescent layer is sandwiched between the hole-transport layer and the electron-transport layer.

In this element of either structure, electrons and holes are injected into the luminescent layer and emit light as a result of recombination. The electron-transport layer and the hole-transport layer have a function of increasing the injection probability.

Figure 3:
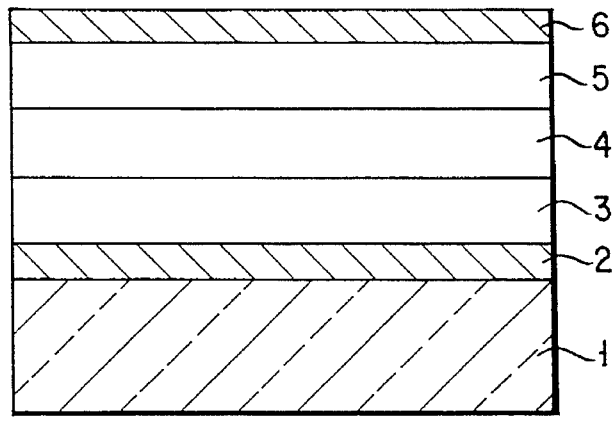
FIG. 3 is a sectional view showing an organic EL element according to the present invention.

FIG. 3 is a longitudinal sectional view showing a practical example of an organic EL element with a three-layered structure. Referring to FIG. 3, an ITO electrode 2, a hole-transport layer 3, a luminescent layer 4, an electron-transport layer 5, and an upper electrode 6 are formed in sequence in the order named on a glass substrate 1, constituting an organic EL element.

(Organic solar cell element)

This element has a structure in which an organic thin film is sandwiched between two electrodes at least one of which is a transparent electrode. This organic thin film has either a two-layered structure constituted by a charge-generation layer containing dye molecules, which absorb visible light to generate electrons and holes, and a hole-transport layer or an electron-transport layer, or a multilayered structure constituted by three or more layers, in which the charge-generation layer is sandwiched between the hole-transport layer and the electron-transport layer.

This element of either structure efficiently performs charge separation by preventing recombination of electrons and holes generated, increasing the photoelectric conversion efficiency.

(Organic photoconductor)

This element has a two-layered structure formed by stacking a charge-generation layer containing dye molecules, which absorb visible light to generate electrons and holes, and a carrier-transport layer containing at least one of a hole-transport agent and an electron-transport agent.

First, in the case of a negative type photosensitive body in which the carrier-transport layer contains the hole-transport agent, the surface of the photosensitive body is negatively charged by corona discharge or the like; in the case of a positive type OPC in which the carrier-transport layer contains the electron-transport agent, the surface of the photosensitive body is positively charged by corona discharge or the like. Thereafter, when recording light is incident on the OPC, electrons and holes are generated only in a portion where the light is incident.

In the negative type OPC, the holes generated are efficiently transported to the surface, canceling out the negative charge. Therefore, when toner is negatively charged beforehand, the toner adheres to only a portion where light is incident, and the resulting toner image is printed on paper.

In the positive type OPC, the electrons generated are efficiently transported to the surface, canceling out the positive charge. Therefore, when toner is positively charged beforehand, the toner adheres to only a portion where light is incident, and the resulting toner image is printed on paper.

(Organic rectifying element)

This element has a structure in which an organic thin film with a two-layered structure constituted by a hole-transport layer (p-type semiconductor) and an electron-transport layer (n-type semiconductor) is sandwiched between two electrodes.

In this element, like a pn junction of an inorganic semiconductor, rectification occurs because only electrons and holes are transported. Note that like in inorganic semiconductors, the current density can be increased by doping a small amount of an acceptor in the hole-transport layer and a small amount of a donor in the electron-transport layer.

(Optical switching element)

Figure 4:
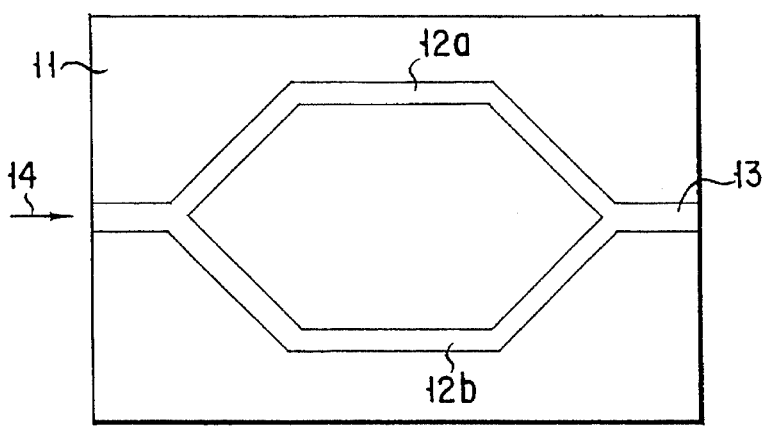
FIG. 4 is a plan view showing an optical switching element according to the present invention.

FIG. 4 is a plan view showing the structure of an optical switching element. In this element, as shown in FIG. 4, a waveguide 13 having two branches 12a and 12b is formed in an organic thin film 11 formed on a substrate. This waveguide has a high refractive index with respect to the surrounding region and a third nonlinear optical effect. Means for applying a voltage to only the branch 12a of the waveguide 13 is also provided to change the refractive index of the branch 12a by applying a voltage, thereby changing the length of the optical path.

In this optical switching element, an appropriate voltage is applied to the branch 12a such that the phases of two light components with different optical path lengths are shifted by exactly a half wavelength when light 14 incident on the waveguide 13 passes through the branches 12a and 12b and reaches a confluent point. As a result, interference of light occurs at the confluent point of the branches 12a and 12b upon application of the voltage. Therefore, the output light can be switched on or off in accordance with the presence/absence of the application of the voltage.

(Recording medium)

This recording medium has a structure in which a thin film consisting of amorphous dye molecules which absorb semiconductor laser light or a thin film formed by homogeneously mixing amorphous dye molecules into an amorphous polymer is formed on a substrate.

In this recording medium, writing is performed by raising the temperature of a particular region by radiating laser light onto the thin film or using a thermal head, thereby crystallizing the dye molecules. Since light is scattered in the region subjected to the writing, reading can be performed by detecting the scattered light. Erasure is performed by melting the thin film by further increasing the temperature and then returning the thin film to a homogeneous amorphous state.

EXAMPLES

The present invention will be described in more detail below by way of its examples.

Example 1 (Organic electroluminescence element)

A 50-nm thick triphenylamine derivative (hole-transport layer) represented by Formula (1) was vapor-deposited on an ITO film/glass substrate. Pentaphenylcyclopentadiene 30 nm in thickness (luminescent layer) was vapor-deposited on the resultant structure. Subsequently, a 50-nm thick oxadiazole derivative (electron-transport layer) represented by Formula (2) was vapor-deposited on the structure, forming an organic thin film with a three-layered structure. This oxadiazole derivative had $\Sigma \Delta Str,m/Mw$ of 55 and Tg of 175° C. Finally, three aluminum electrodes each 1 cm$^2$ in area were formed.

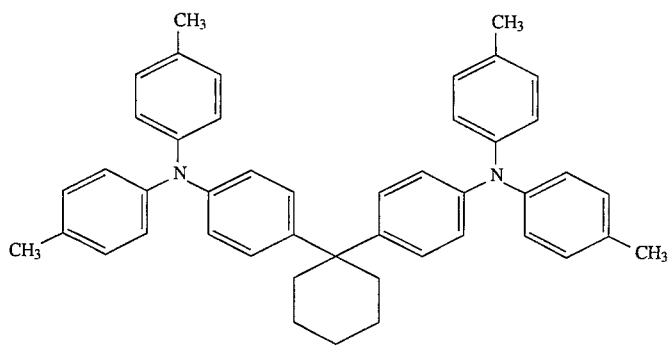

(1)

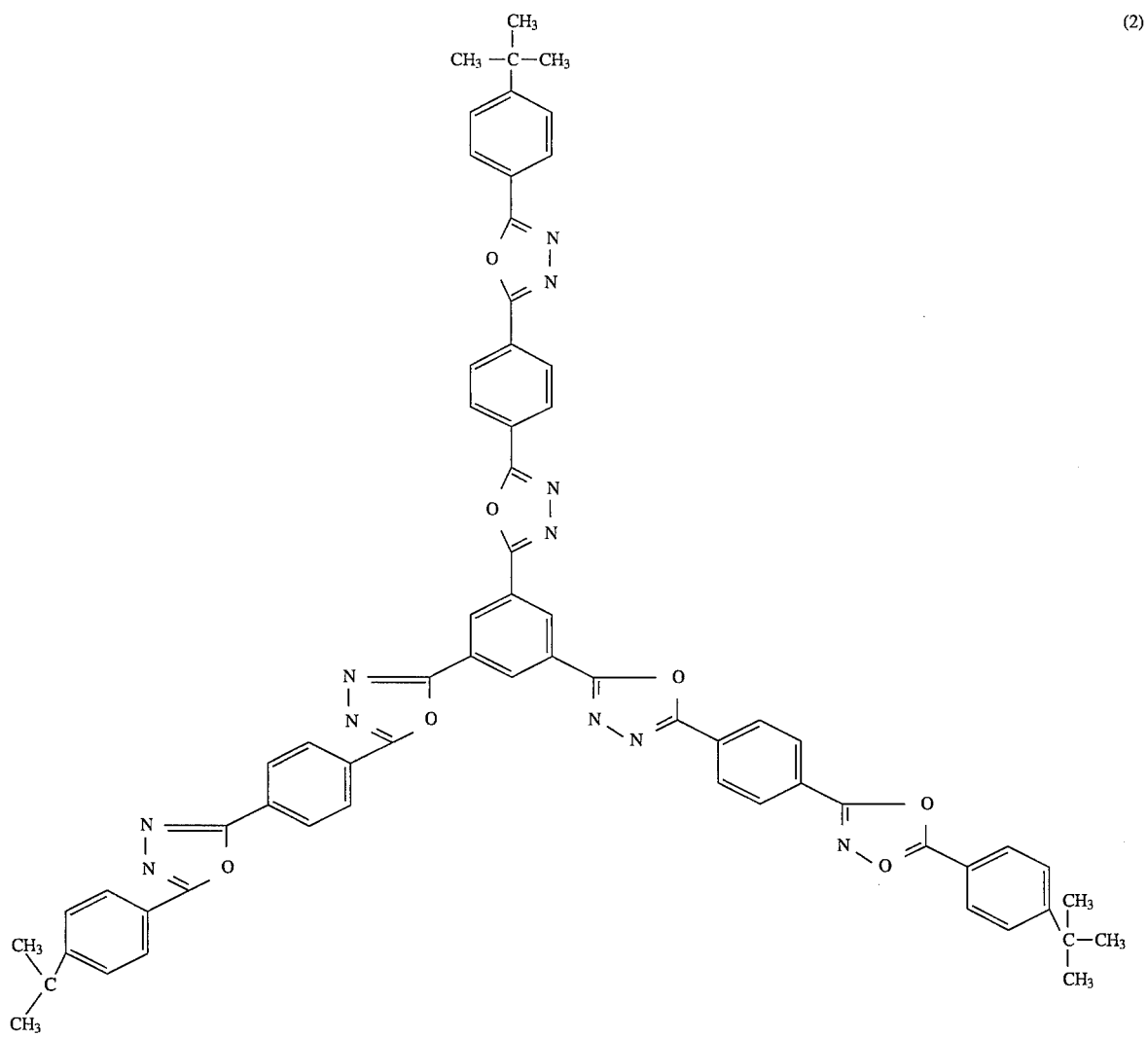

(2)

The initial luminance of the resultant element was measured in a vacuum at a DC voltage of 10 V immediately after the manufacture of the element. The element exhibited a luminance of 500 cd/m². When the element was driven continuously, it took five days to reduce the initial luminance by one-half.

Example 2 (Organic electroluminescence element)

An organic electroluminescence element was manufactured following the same procedures as in Example 1 except that an oxadiazole derivative represented by Formula (3) was used in place of the oxadiazole derivative represented by Formula (2). This oxadiazole derivative had ΣΔStr,m/Mw of 52 and Tg of 180° C.

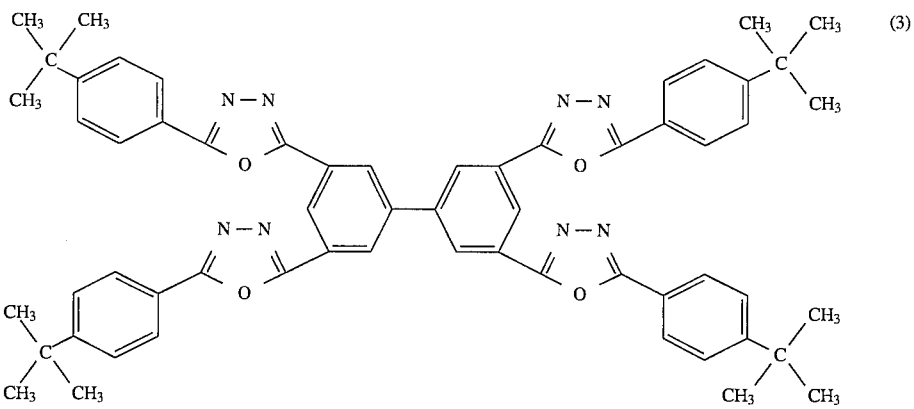

The initial luminance of the resultant element was measured in a vacuum at a DC voltage of 10 V immediately after the manufacture of the element. The element exhibited a luminance of 600 cd/m². When the element was driven continuously, it took seven days to reduce the initial luminance by one-half.

Example 3 (Organic electroluminescence element)

An organic electroluminescence element was manufactured following the same procedures as in Example 1 except that a benzoxazole derivative represented by Formula (4) was used in place of the oxadiazole derivative represented by Formula (2). This benzoxazole derivative had $\Sigma\Delta Str,m/Mw$ of 50 and Tg of 180° C.

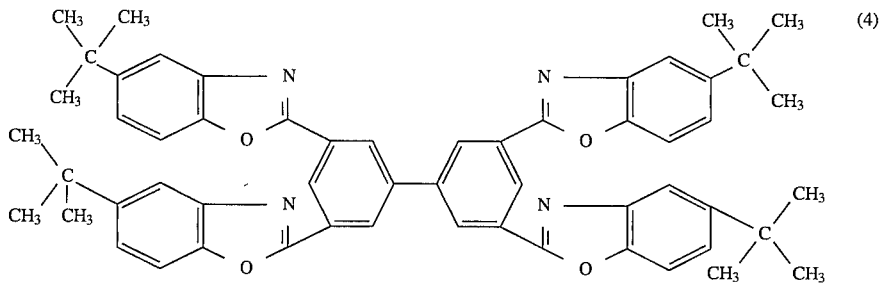

The initial luminance of the resultant element was measured in a vacuum at a DC voltage of 10 V immediately after the manufacture of the element. The element exhibited a luminance of 400 cd/m². When the element was driven continuously, it took seven days to reduce the initial luminance by one-half.

Comparative Example 1 (Organic electroluminescence element)

An organic electroluminescence element was manufactured following the same procedures as in Example 1 except that an oxadiazole derivative represented by Formula (5) was used in place of the oxadiazole derivative represented by Formula (2). This oxadiazole derivative had $\Sigma\Delta Str,m/Mw$ of 61 and Tg of 140° C.

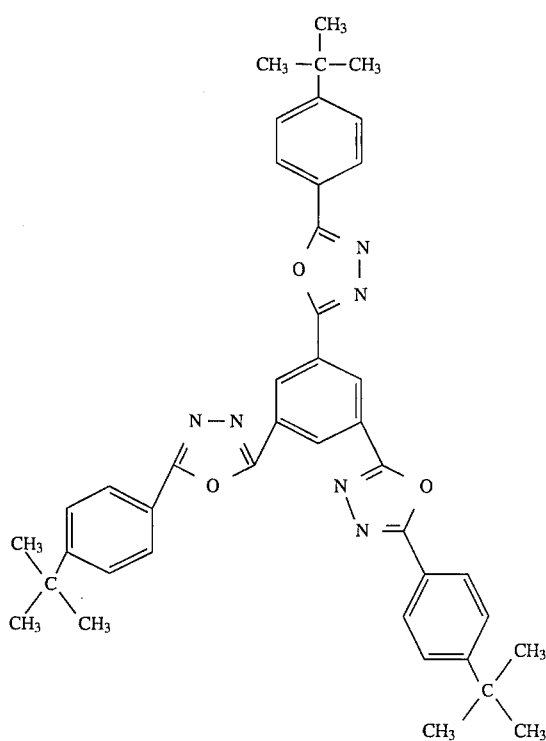

(5)

The initial luminance of the resultant element was measured in a vacuum at a DC voltage of 10 V immediately after the manufacture of the element. The element exhibited a luminance of 500 cd/m². When the element was driven continuously, the initial luminance was reduced by one-half in two days.

Example 4 (Organic electroluminescence element)

An organic electroluminescence element was manufactured following the same procedures as in Example 1 except that a mixture of oxadiazole derivatives represented by Formula (6) was used in place of the oxadiazole derivative represented by Formula (2). The mixture of oxadiazole derivatives had a sum total of an entropy change of melting and an entropy change of transition from a glass transition point to a melting point per unit mass of 55 J/(K.kg) and Tg of 165° C.

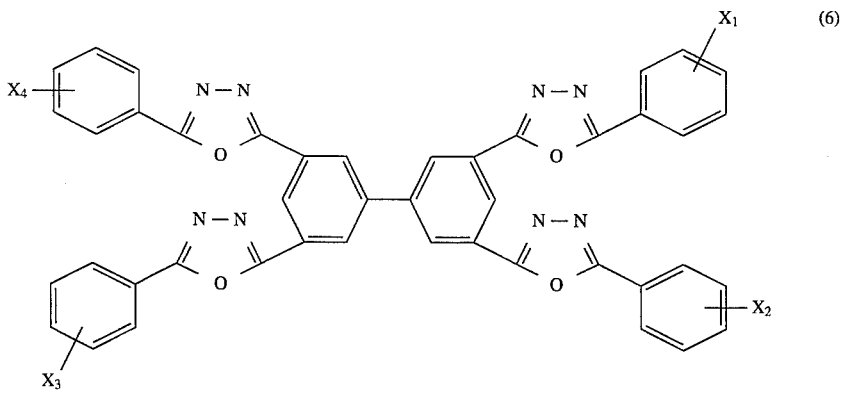

(6)

(wherein each of $X_1$ to $X_4$ represents a hydrogen atom or a fluorine atom)

The initial luminance of the resultant element was measured in a vacuum at a DC voltage of 10 V immediately after the manufacture of the element. The element exhibited a luminance of 400 cd/m². When the element was driven continuously, it took five days to reduce the initial luminance by one-half.

Example 5 (Organic electroluminescence element)

An organic electroluminescence element was manufactured following the same procedures as in Example 1 except that a quinacridone derivative represented by Formula (7) was used in place of the triphenylamine derivative represented by Formula (1). This quinacridone derivative had Mw of 424 and two sites where formation of a hydrogen bond was possible.

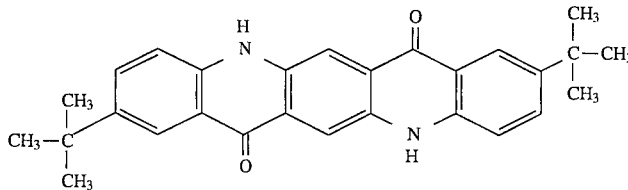
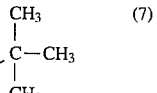

The initial luminance of the resultant element was measured in a vacuum at a DC voltage of 10 V immediately after the manufacture of the element. The element exhibited a luminance of 700 cd/m². When the element was driven continuously, it took ten days to reduce the initial luminance by one-half.

Comparative Example 2 (Organic electroluminescence element)

An organic electroluminescence element was manufactured following the same procedures as in Example 5 except that a quinacridone derivative represented by Formula (8) was used in place of the quinacridone derivative represented by Formula (7). This quinacridone derivative had Mw of 438 but had only one site where formation of a hydrogen bond was possible.

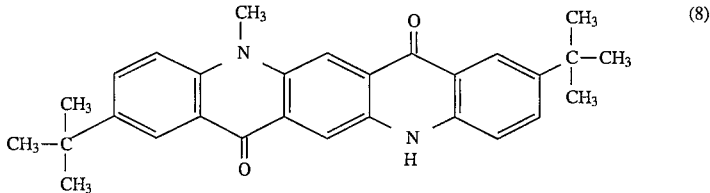

The initial luminance of the resultant element was measured in a vacuum at a DC voltage of 10 V immediately after the manufacture of the element. The element exhibited a luminance of 700 cd/m². When the element was driven continuously, the initial luminance was reduced by one-half in six days.

Example 6 (Organic solar cell element)

A 50-nm thick triphenylamine derivative (hole-transport layer) represented by Formula (1) was vapor-deposited on an ITO film/glass substrate. A copper phthalocyanine (charge-generation layer) 50 nm in thickness was vapor-deposited on the resultant structure. Subsequently, a 50-nm thick oxadiazole derivative (electron-transport layer) represented by Formula (2) was vapor-deposited on the structure, thereby manufacturing an organic thin film with a three-layered structure. Finally, three aluminum electrodes each 1 cm² in area were formed.

The initial photoelectric conversion efficiency of the resultant element was measured in a vacuum by radiating light, from the glass substrate side, of a tungsten lamp from which ultraviolet rays of 400 nm or less were cut. Each of the three electrodes measured presented a value of 1.2% to 1.5%. When the element was driven continuously, it took one month to reduce the photoelectric conversion efficiency by one-half.

Comparative Example 3 (Organic solar cell element)

An organic solar battery element was manufactured following the same procedures as in Example 6 except that an oxadiazole derivative represented by Formula (9) was used in place of the oxadiazole derivative represented by Formula (2). This oxadiazole derivative had $\Sigma\Delta Str,m/Mw$ of 127 and Tg of 77° C.

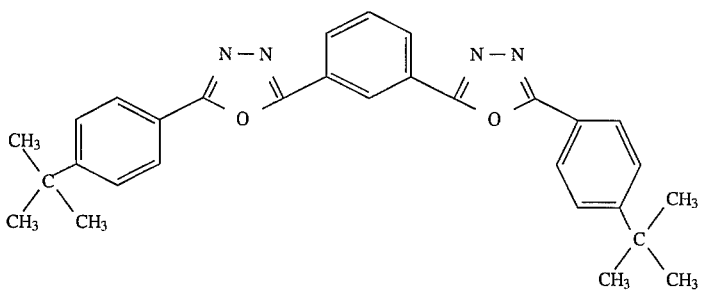
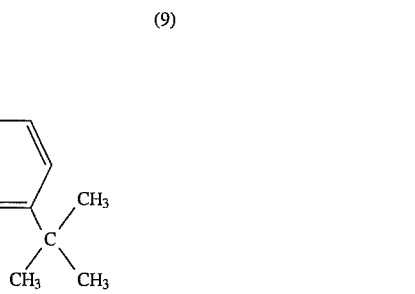

(9)

The initial photoelectric conversion efficiency of the resultant element was measured in a vacuum by radiating light, from the glass substrate side, of a tungsten lamp from which ultraviolet rays of 400 nm or less were cut. Each of the three electrodes measured presented a value of 1.2% to 1.5%. When the element was driven continuously, the photoelectric conversion efficiency was reduced by one-half in a week.

Example 7 (Organic electrophotographic photosensitive body)

Polycarbonate in which copper naphthalocyanine was dispersed was cast on an aluminum vapor-deposited film formed on glass, forming a 2-μm thick coating film (charge-generation layer). Subsequently, polycarbonate in which a triphenylamine derivative (hole-transport agent) represented by Formula (10) and the oxadiazole derivative (electron-transport agent) represented by Formula (2) were dissolved at ratios of 20 wt % and 30 wt %, respectively, was cast on the resultant structure, forming a 2-μm thick coating film (carrier-transport layer).

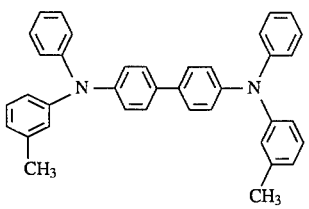

(10)

The attenuation in surface charge potential of the resultant photosensitive body was measured by radiating monochromatic light (0.4 μW/cm²) of 630 nm immediately after the manufacture of the photosensitive body. The photosensitive body exhibited high sensitivities of about 2 cm²/μJ for both positive and negative charges. Thereafter, this organic photoconductor was left to stand in a nitrogen flow at room temperature for three months and subjected to the same measurement. As a result, no degradation in characteristics due to the storage was found.

Comparative Example 4 (Organic photoconductor)

An OPC film was manufactured following the same procedures as in Example 7 except that the oxadiazole derivative represented by Formula (9) was used in place of the oxadiazole derivative represented by Formula (2).

The attenuation in surface charge potential of the resultant OPC was measured by radiating monochromatic light (0.4 μW/cm²) of 630 nm immediately after the manufacture of the OPC. The OPC exhibited high sensitivities of about 2 cm²/μJ for both positive and negative charges. Thereafter, this organic OPC was left to stand in a nitrogen flow at room temperature for three months and subjected to the same measurement. As a result, the OPC presented a sensitivity of only 1 cm²/μJ, indicating degradation in characteristics due to the storage. The cause of this result was that molecules of the oxadiazole derivative were in part crystallized in the organic thin film.

Example 8 (Organic rectifying element)

A 20-nm thick triphenylamine derivative (hole-transport layer) represented by Formula (1) was vapor-deposited on an aluminum vapor-deposited electrode formed on glass. Subsequently, a 20-nm thick oxadiazole derivative (electron-transport layer) represented by Formula (3) was vapor-deposited on the resultant structure, forming an organic thin film with a two-layered structure. Finally, three upper aluminum electrodes each 1 cm² in area were formed.

The current-voltage characteristic of the resultant element was measured in a vacuum while shielding light immediately after the manufacture of the element. The element showed a rectification characteristic of flowing a current when the upper electrode was set negative. Thereafter, the element was left to stand in a nitrogen flow at room temperature for three months and subjected to the measurement of the current-voltage characteristic. As a result, no change was found in the current-voltage characteristic, indicating no degradation in the characteristic due to the storage.

Example 9 (Optical switching element)

A polycarbonate thin film containing 30 wt % of a pyrene derivative represented by Formula (11) was formed on a substrate. This pyrene derivative had ΣΔStr,m/Mw of 58 and Tg of 170° C. The pyrene skeleton was oxidized by radiating ultraviolet rays onto the resultant polycarbonate thin film through a mask in the air in such a manner as to form a waveguide pattern having two branches as shown in FIG. 4. As a result, a waveguide having a higher refractive index than that of the surrounding region and a third nonlinear optical effect was formed.

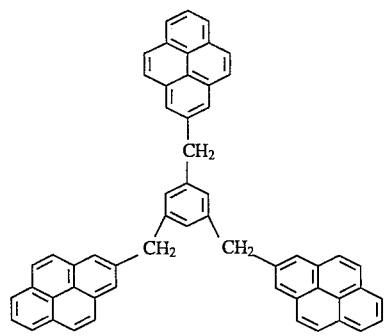

(11)

Portions of a region irradiated with light and a region not irradiated with light were peeled from the resultant polycarbonate thin film, and the glass transition point of each portion was measured using a DSC. Each portion was found to have a glass transition point of 160° C., indicating no reduction in Tg of polycarbonate.

In addition, in this element, it was possible to shift the phases of two light components by exactly a half wavelength when light passing through the two branches reached a confluent point by applying a voltage to one of the branches of the waveguide to change the refractive index of that branch. Therefore, the output light could be switched on or off in accordance with the presence/absence of the application of the voltage.

Example 10 (Optical disk)

Red dye molecules represented by Formula (12) were vapor-deposited to have a thickness of 3 μm on a polycarbonate substrate. This red dye molecule had ΣΔStr,m/Mw of 56 and Tg of 170° C. The resultant film was found to have a homogeneous amorphous structure.

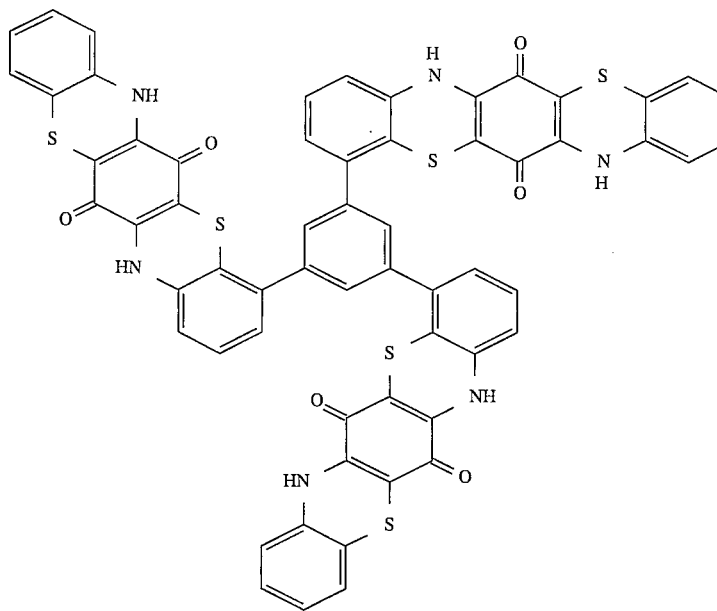

(12)

The dye molecules were crystallized by spot-radiating light pulses of a red semiconductor laser onto the resultant optical disk. The laser light of a low output was found to be scattered at that spot, allowing writing of data. Subsequently, the dye molecules were melted by radiating high-output laser light pulses and then cooled with air. As a result, the dye molecules were returned to the homogeneous amorphous state, making erasure of the data feasible. It was possible to perform this data write-erasure operation 10,000 times or more on this optical disk. The optical disk was left to stand in the atmosphere at room temperature for three months and subjected to the same measurement of the recording characteristic. Consequently, no degradation in the recording characteristic due to the storage was found.

Example 11 (Transparent organic glass plate)

10 wt % of the oxadiazole derivative represented by Formula (3) were mixed as an ultraviolet absorbing dye in polycarbonate (Tg=160° C.), and the resultant mixture was melt-molded to manufacture a transparent polycarbonate plate. The ultraviolet absorbing dye has a function of converting absorbed ultraviolet rays into heat or long-wavelength fluorescence, thereby preventing degradation in a polymer due to ultraviolet rays. A portion of this polycarbonate plate was chipped off, and the glass transition point of that portion was measured by a DSC. As a result, the glass transition point was 160° C., demonstrating that the Tg of the polycarbonate did not decrease at all. The polycarbonate plate was left to stand outdoors for six months, but neither coloring nor change in Tg occurred, indicating that almost no degradation took place.

Comparative Example 5 (Transparent organic glass plate)

A transparent polycarbonate plate was manufactured following the same procedures as in Example 11 except that an oxadiazole derivative represented by Formula (9) was used in place of the oxadiazole derivative represented by Formula (3). A portion of the resultant polycarbonate plate was chipped off, and the glass transition point of that portion was measured using a DSC. As a result, it was found that the glass transition point was reduced to 130° C.

Example 12 (Colored organic glass plate)

30 wt % of yellow dye molecules represented by Formula (13) were mixed in polycarbonate (Tg=160° C.), and the resultant mixture was melt-molded to manufacture a yellow transparent polycarbonate plate. This yellow dye molecule had ΣΔStr,m/Mw of 50 and Tg of 190° C.

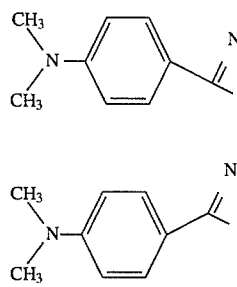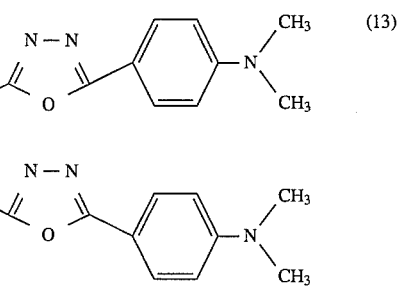

(13)

A portion of the resultant polycarbonate plate was chipped off, and the glass transition point of that portion was measured by using a DSC. As a result, the glass transition point was 160° C., demonstrating that the Tg of the polycarbonate did not decrease at all. The polycarbonate plate was left to stand indoors for one year, but neither the coloring condition nor the Tg changed, demonstrating that almost no degradation occurred.

What is claimed is:

1. An amorphous organic thin-film element comprising an organic thin film containing dye molecules with $\Sigma\Delta Str,m$ (J/(K.kmol))/Mw of not more than 60, assuming that a molecular weight is Mw and the sum total of an entropy change of melting and entropy changes of transition from a glass transition point to a melting point is $\Sigma\Delta Str,m$ (J/(K.kmol)).

2. An element according to claim 1, wherein the $\Sigma\Delta Str,m$ (J/(K.kmol))/Mw of said dye molecule is not more than 55.

3. An element according to claim 1, wherein the glass transition point of said dye molecule is not less than 170° C.

4. An element according to claim 1, wherein Mw/(Tm.$\Delta$Hm) of said dye molecule is not less than 0.04, assuming that a molecular weight is Mw, a melting point is Tm (K), and an enthalpy change of melting is $\Delta$Hm (kJ/mol).

5. An element according to claim 1, wherein said dye molecule has a symmetrical structure.

6. An element according to claim 1, wherein said dye molecule has a phenyl group, a polyphenyl group, or a condensed ring at the center thereof, and dye skeletons are radially bonded to the skeleton of said group.

7. An element according to claim 6, wherein a bulky substituent group is bonded to the outermost portion of said dye molecule.

8. An element according to claim 7, wherein said bulky substituent group is a t-butyl group.

9. An element according to claim 1, wherein any of a hole-transport layer, a luminescent layer, and an electron-transport layer, which constitute a three-layered structure of said organic thin film, contains dye molecules with $\Sigma\Delta Str,m$ (J/K.kmol))/Mw of not more than 60 and emits light upon application of an electric field.

10. An amorphous organic thin-film element comprising an organic thin film containing dye molecules which have a molecular weight of not less than 350, and each of which has a plurality of sites where an intermolecular hydrogen bond can be formed.

11. An element according to claim 10, wherein the molecular weight of said dye molecule is not less than 450.

12. An element according to claim 10, wherein said dye molecules have $\Sigma\Delta Str,m$ (J/(K.kmol))/Mw of not more than 60, assuming that a molecular weight is Mw and the sum total of an entropy change of melting and entropy changes of transition from a glass transition point to a melting point is $\Sigma\Delta Str,m$ (J/(K.kmol)).

13. An amorphous organic thin-film element comprising, in an amorphous polymer, dye molecules with $\Sigma\Delta Str,m$ (J/(K.kmol))/Mw of not more than 60, assuming that a molecular weight is Mw and the sum total of an entropy change of melting and entropy changes of transition from a glass transition point to a melting point is $\Sigma\Delta Str,m$ (J/(K.kmol)).

14. An element according to claim 6 wherein at least three dye skeleton molecules are bonded to the central skeletal structure of the dye molecule.

15. An element according to claim 6 wherein the central skeletal structure of the dye molecule consists of a benzene ring, and dye skeletons are introduced at the 1-, 3-, and 5-positions of the benezene ring.

16. An element according to claim 6 wherein the central skeletal structure of the dye molecule consists of a biphenyl ring, and dye skeletons are introduced at the 3-, 3'-, 5-, and 5'-positions of the biphenyl ring.

* * * * *